United States Patent
Wang

(10) Patent No.: US 8,279,004 B2
(45) Date of Patent: Oct. 2, 2012

(54) SYSTEM FOR DRIVER AMPLIFIER

(75) Inventor: Ting-Hao Wang, Hsinchu (TW)

(73) Assignee: Global Unichip Corp., Hsinchu (TW)

(*) Notice: Subject to any disclaimer, the term of this patent is extended or adjusted under 35 U.S.C. 154(b) by 111 days.

(21) Appl. No.: 12/829,258

(22) Filed: Jul. 1, 2010

(65) Prior Publication Data

US 2012/0001690 A1    Jan. 5, 2012

(51) Int. Cl.
*H03F 3/45* (2006.01)
(52) U.S. Cl. ............ 330/261; 330/258; 330/260
(58) Field of Classification Search ......... 330/98, 330/133, 150, 258, 260, 261, 310
See application file for complete search history.

(56) References Cited

U.S. PATENT DOCUMENTS

| | | | | |
|---|---|---|---|---|
| 6,476,678 B1* | 11/2002 | Kolluri et al. | ......... | 330/133 |
| 6,833,760 B1* | 12/2004 | Aude | ......... | 330/261 |
| 7,622,995 B2* | 11/2009 | Lee et al. | ......... | 330/310 |
| 2005/0231277 A1* | 10/2005 | Ogawa | ......... | 330/98 |

* cited by examiner

*Primary Examiner* — Khanh V Nguyen
(74) *Attorney, Agent, or Firm* — Slater & Matsil, L.L.P.

(57) ABSTRACT

In an embodiment, a circuit includes a two-stage amplifier and a feedback component. The two stage amplifier consists of an input stage biased at a first power supply voltage, and an output stage biased at a second power supply voltage. The second power supply voltage is greater than the first power supply voltage, and the second stage is configured for high voltage operation. The feedback component is connected between the output stage to the input stage.

18 Claims, 4 Drawing Sheets

SYSTEM FOR DRIVER AMPLIFIER

TECHNICAL FIELD

This invention relates generally to semiconductor circuits, and more particularly to a system for a driver amplifier.

BACKGROUND

High power amplifiers are prevalent in a number of applications including audio power amplifiers for driving loudspeakers, RF transmitters for communications systems, and driver amplifiers for transmission lines. A typical high power amplification system has a series of cascaded amplification stages, each stage of which successively amplifies a system input until a desired output level is reached at the final output stage. For such power amplification systems, power consumption can be appreciable, even in the first few stages of amplification.

For example, an audio amplifier designed to source a large current into a capacitive load may be biased at voltages greater than 20V. An amplifier used in consumer and professional audio applications may contain a number of stages including audio processing, filtering, gain control, and other stages. If the earlier stages the audio amplifier are biased at the same high voltage as last amplifier, power efficiency is lost if the signal headroom significantly exceeds the amplitude of the expected peak signal. For example, if a class A amplifier is biased to supply voltage of 20V, but the peak-to-peak signal swing is 1V, much of the amplifier's power will be dissipated in the amplifier's devices rather than in the load.

In particular, multi-stage feedback power amplifiers operate inefficiently because the signal levels in the first stage of the power amplifier typically has much more headroom than the output stage. Therefore, power is wasted in the input stage. Using separately biased amplifiers for each stage of a multi-stage feedback amplifier poses problems. For example, if a multi-stage amplifier requires global feedback to set gain and improve linearity, extra parasitics induced by the coupling of separate stages can cause instability and introduce manufacturing difficulties due to component and temperature variation.

In the field of power amplification systems, what is needed are power-efficient circuits and systems.

SUMMARY OF THE INVENTION

In an embodiment, a circuit includes a two-stage amplifier and a feedback component. The two stage amplifier consists of an input stage biased at a first power supply voltage, and an output stage biased at a second power supply voltage. The second power supply voltage is greater than the first power supply voltage, and the second stage is configured for high voltage operation. The feedback component is connected between the output stage to the input stage.

In a further embodiment, a semiconductor circuit includes a two-stage amplifier consisting of a first stage comprising a differential pair loaded by a first active load, a second stage coupled to an output of the first stage, and a feedback capacitor connected between the first stage and the second stage. The first stage configured to be coupled to a low voltage power supply. The second stage includes an amplifying transistor coupled to an output of the first stage, and a second active load coupled to an output of the amplifying transistor. The second stage is configured to be coupled to a high voltage power supply greater than 10V.

In a further embodiment, an amplifier has a differential pair having transistors of a first type, where the differential pair is referenced to a first power supply. The amplifier also has a plurality of first load transistors of a second type, where the second type different from the first type. The plurality of first load transistors has drains coupled to drains of the differential pair and sources connected to a reference node. A plurality of gain transistors of the second type has gates connected to the drains of the differential pair and to the drains of the first load transistors. The amplifier also has a plurality of second load transistors of the first type having drains that are connected to drains of the plurality of gain transistors, and sources connected to a high voltage power supply. A plurality of capacitors are coupled between the drains of the first load transistor the drains of the plurality of gain transistors. Gates of the differential pair form an input to the amplifier and drains of the second load transistors form an output of the amplifier.

The foregoing has outlined, rather broadly, features of the present invention. Additional features of the invention will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to embodiments in a specific context, namely a system for a power-efficient power amplifier. Embodiments of this invention may also be applied to other circuits and systems that require power efficient operation.

Figure 1:
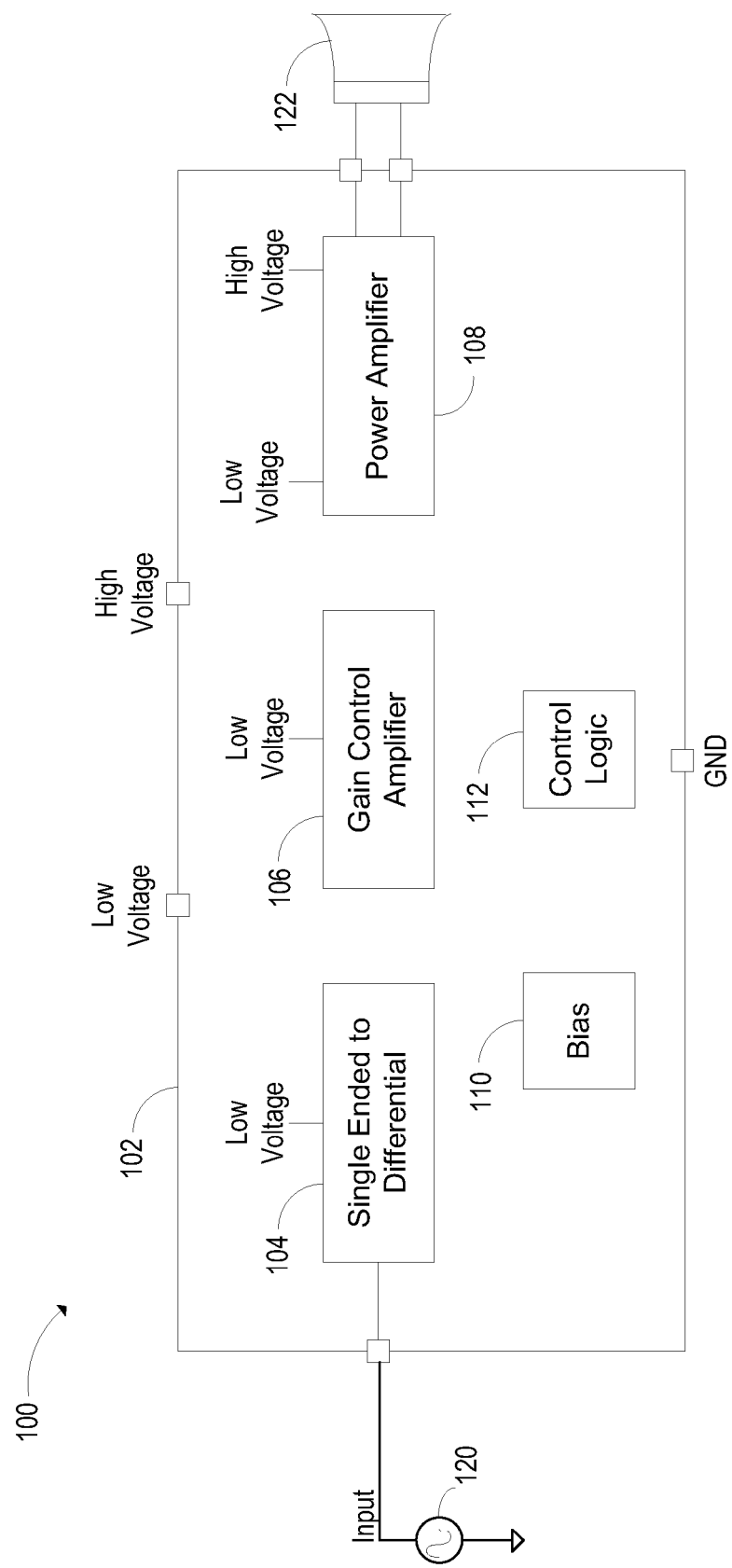
FIG. 1 illustrates a block diagram of an embodiment amplifier system.

FIG. 1 illustrates embodiment system 100 used for an audio application. The output of audio signal source 120 is amplified by amplifier system circuit 102, which drives loudspeaker 122. Signal source 120 can be any audio signal source, for example, a line level audio signal from the output of a CD player or MP3 player. In embodiments of the present invention, amplifier system circuit 102 is a circuit board containing a number of electronic components. Alternatively amplifier system circuit 102 can be made of one or more integrated circuits.

In embodiments of the present invention, the single-ended output of signal source 120 is amplified by single-ended to differential amplifier 104, which is designed according to techniques known in the art. By performing a single-ended to differential conversion, the resulting balanced signal path has a higher power supply rejection ration (PSRR), and can, therefore, withstand more noise on the low voltage and high voltage power supplies. Single ended to differential amplifier 104 is preferably powered by a low voltage power supply, for example, between about 2.5 V and about 3.3 V. In embodiments of the present invention, the gain of single ended to differential amplifier 104 is between about −6 dB and about 6 dB. Alternatively, single ended to differential converter 104 have a different supply voltage range and/or a different gain range. Differential to single ended amplifier 104 can be omitted if succeeding stages do not require such a conversion, if signal source 120 is already differential, or if a single ended input is suitable for the particular application.

Gain control amplifier 106 applies a gain to the output of single ended to differential amplifier 104. In an embodiment, the range of applied gain control is between about −12 dB to about 36 dB, and is controllable in either a continuous manner using an analog gain control signal or a discrete manner using a digitally selectable gain. Alternatively, a range of applied gain control can be outside of this range. In an embodiment, gain control amplifier 106 is powered by a low voltage power supply, for example between about 2.5 V and 3.3 V. In audio applications, gain control amplifier 106 can be used to set an audio volume. Gain control amplifier 106 is designed using conventional design techniques and architectures known in the art. In alternative embodiments, other gain control ranges, power supply ranges, and architectures can be used. In further alternative embodiments, gain control amplifier 106 can be omitted from amplifier system 102 depending on the application. For example, a fixed gain audio amplifier that does not require gain adjustment.

Bias block 110 and control logic block 112 interfaces to amplifier blocks 104, 106 and 108 and provides control and bias. In some embodiments, bias 110 and control logic 112 provides low power modes and power down states when amplifier system 102 is not in use. Blocks 110 and 112 can also work together to provides gain control to the system. In some embodiments, control logic 112 is addressable via a user interface (not shown).

In an embodiment, power amplifier 108 is a differential amplifier that amplifies a low signal output of gain control amplifier 106 to a high power output into an external load, which is depicted as loudspeaker 122 in the illustrated embodiment. The gain of amplifier 108 is between about 30 dB and about 40 dB. In order to produce such a high level output, at least the output stage of power amplifier 108 is biased with a high voltage power supply between about 100 V and about 300 V. In alternative embodiments of the present invention, power amplifier 108 can operate under different signal input and output amplifiers, as well as different gain ranges depending on the application. Amplifier 108 can also be targeted toward non-audio applications in alternative embodiments, for example, RF and transmission line applications.

In conventional embodiments, power amplifier 108 is powered by a single power supply voltage. For multistage amplifiers, however, biasing amplifier stages that do not experience high signal levels at a high voltage consumes extra power and does not significantly add to the noise and linearity performance of power amplifier 108.

In an embodiment of the present invention, the first stage of power amplifier is biased with a low voltage power supply, preferably between about 2.5 V and about 3.3 V. The output stage of power amplifier 108 is powered by a high voltage power supply, preferably between about 100 V and about 300 V. In alternative embodiments, other power supply voltage ranges can be used. By powering the first stage of power amplifier 108 with a lower power supply voltage than the output stage, power savings can be realized without significantly degrading the performance of power amplifier 108.

Figure 2:
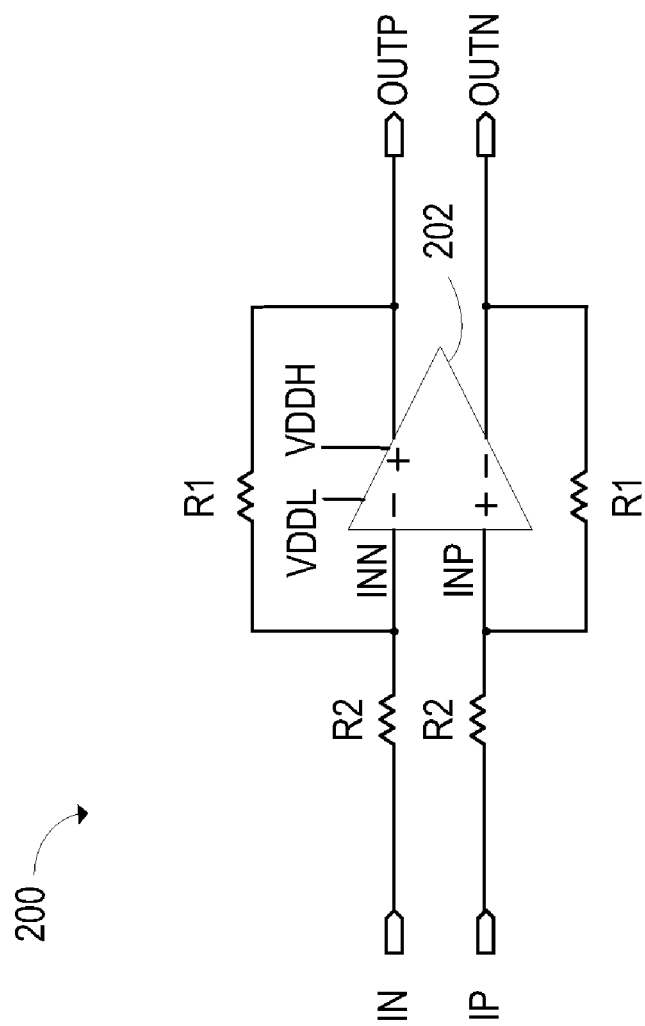
FIG. 2 illustrates an embodiment differential feedback power amplifier.

Embodiment power amplifier 200 is illustrated in FIG. 2. Power amplifier 200 has core differential voltage amplifier 202 with shunt feedback resistors R1 and series input resistors R2. The voltage gain of power amplifier 200 from differential input (IP–IN) to differential output (Outp–Outn) is approximately R1/R2 assuming that voltage amplifier 202 has a high open loop gain. In embodiments, the ratio of R1/R2 is between about 10 and 100. The value of resistors R2 and R1 is preferably made large enough not to significantly impact the power consumption of amplifier 200, but not so large as to constrict the bandwidth, noise and slew rate performance of the amplifier to the point of violating system requirements. In further embodiments of the present invention, amplifier 200 can have a topology different from a differential voltage amplifier 202 with shunt feedback resistors. For example, core voltage amplifier 202 can be a single-ended amplifier.

Figure 3:
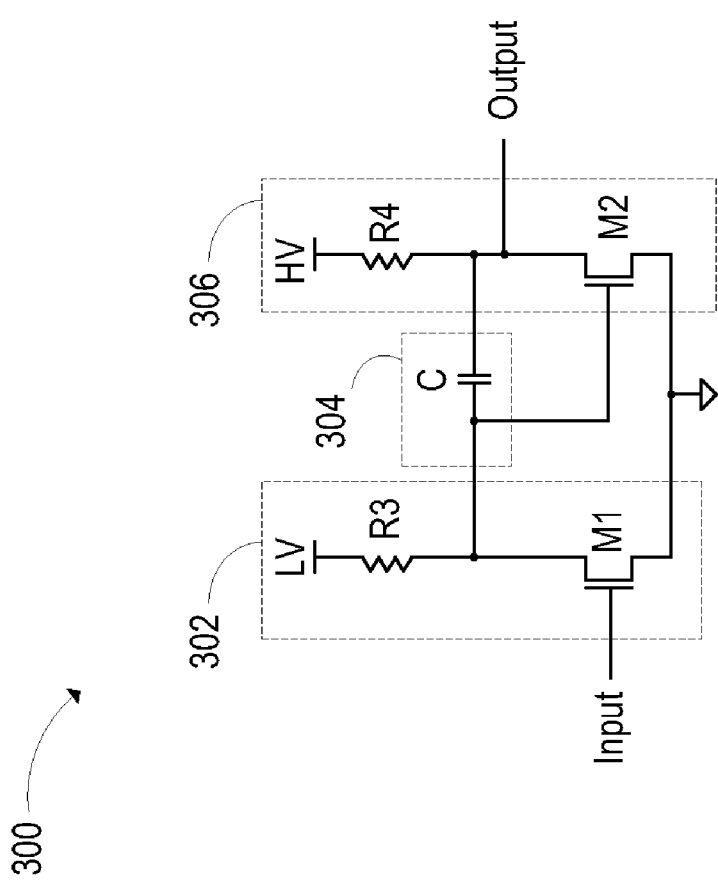
FIG. 3 illustrates an embodiment power amplifier.

FIG. 3 illustrates a simplified circuit diagram of single-ended core amplifier 300. Amplifier 300 has first stage 302 biased by low voltage power supply LV, second stage 306 biased by high voltage power supply HV, and feedback capacitor 304. First stage 302 has transistor M1 loaded by resistor R3, and second stage 306 has transistor M2 loaded by resistor R4. In some embodiments of the present invention, M1 and M2 are n-channel MOSFETs. In alternative embodiments, M1 and M3 can be implemented by other transistor types, for example, bipolar transistors. Load resistors R3 and R4 can also be implemented using other networks besides a simple resistor. Passive networks, such as RC, RL, RLC, and inductive networks can be used for example. R3 and R4 can also be implemented using active loads depending on the particular application and its specifications.

Feedback capacitor C in feedback network C provides a low-frequency pole in the response of amplifier 300, which is located at a frequency of about gm/(2πC) Hz, where gm is the transconductance of transistor M1. This low-frequency pole helps amplifier 300 maintain stability when further feedback is applied around amplifier 300, for example, resistive shunt feedback. Feedback capacitor C is preferably implemented on-chip, however an off-chip capacitor can be used in alternative embodiments. In an embodiment, transistor M2 is implemented using a transistor that can withstand higher voltages without damaging the device. This can be implemented using a thicker gate oxide, a longer channel length, and/or adding a cascode transistor (not shown) in series with the drain of M2.

Figure 4:
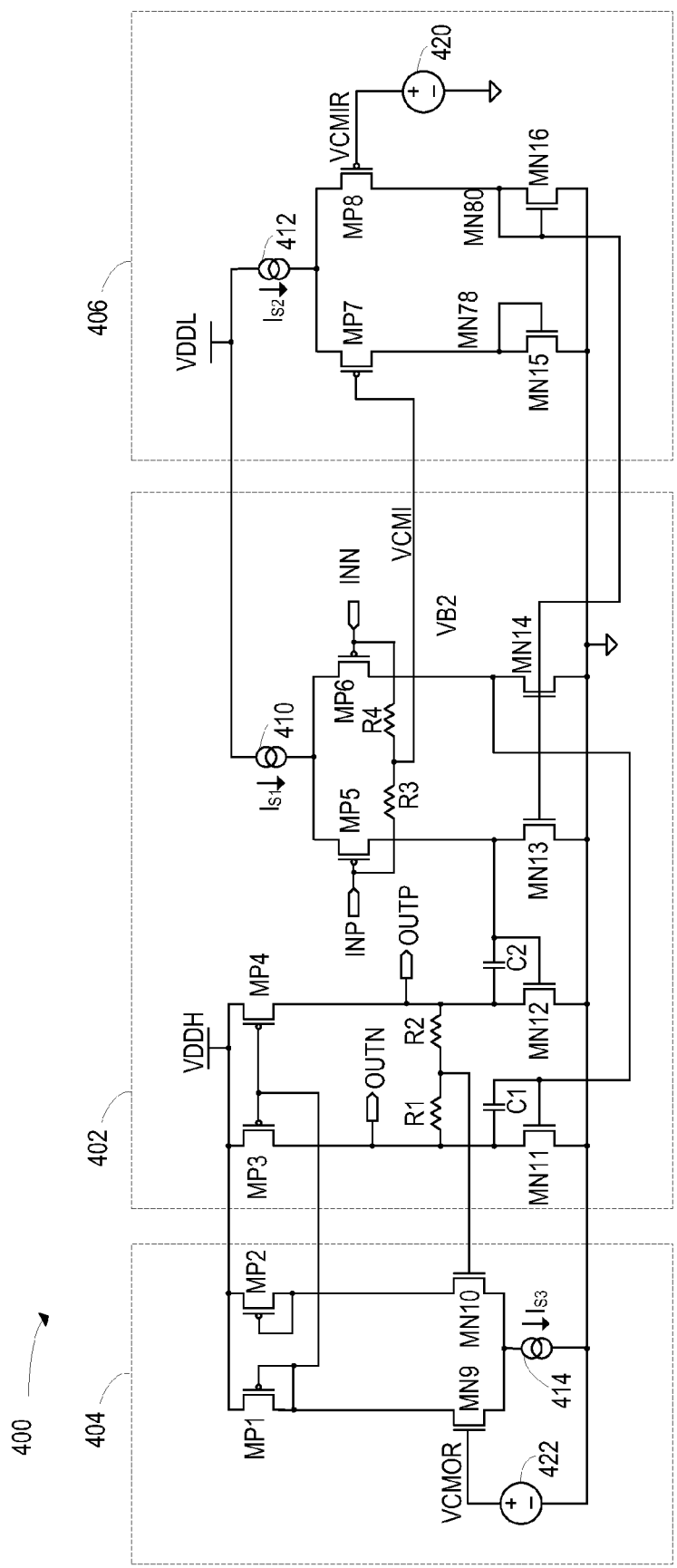
FIG. 4 illustrates an embodiment differential power amplifier.

A schematic of another embodiment power amplifier 400 is illustrated in FIG. 4. Power amplifier 400 has differential amplifier core 402, input common mode bias circuit 406 and output common mode bias 404. Core amplifier 402 has an input stage having a differential pair made of PMOS transistors MP5 and MP6 biased by current source 410 and loaded by active NMOS load transistors MN13 and MN14 respectively. Input common mode bias circuit 406 measures the input common mode VCMI voltage via resistors R3 and R4 and compares input common mode voltage VCMI to a generated common mode reference voltage VCMIR via a differential pair made of PMOS transistors MP7 and MP8 biased with current source 412. The drains of MP7 and MP8 are loaded by diode-connected PMOS transistors MP15 and MP16 respectively. The gate and drain of MN16 are coupled to the gates of input stage active load transistors MN13 and MN14. The input stage of core amplifier 402 and common mode input bias 406 are powered by low voltage power supply VDDL.

The output stage of core amplifier 402 has output NMOS transistors MN11 and MN12 loaded by active PMOS load transistors MP3 and MP4 respectively. The gates of transistors MN11 and MN12 are coupled to the drains of MP6 and MP5 respectively. Capacitor C1 is coupled between the drain and gate of MN11 and capacitor C2 coupled between the drain and gate of MN12. These capacitors provide local feedback and introduce a low-frequency pole that sets the open loop bandwidth of power amplifier 400.

The embodiment output stage of core amplifier 402 is biased by common mode output bias circuit 404. Output common voltage VCMO is measured by resistors R5 and R6 and compared to output common mode reference voltage VCMOR by NMOS differential pair made of transistors MN9 and MN10 that are biased by current source 414. Transistors MN9 and MN10 are loaded by diode connected PMOS transistors MP1 and MP3 respectively. The gate and drain of MP1 is coupled to the gates of output stage load transistors MP3 and MP4. The output stage of core amplifier 402 and output common mode output bias circuit 404 form a feedback loop that sets output common mode voltage VCMO to be about VCMOR. Both the output stage of core amplifier 402 and common mode output bias circuit 404 are referenced to high voltage power supply VDDH.

Current sources 410, 412 and 414, voltage sources 420 and 422, and are designed using conventional architectures known in the art. Accordingly, all transistors in power amplifier 400 are sized and biased according to techniques known in the art, however, transistors in the output stage of core amplifier 402 and output common mode bias circuit 404 are preferably implemented using high voltage transistors that can withstand supply voltage VDDH. In embodiments of the present invention, VDDL is between about 2.5 V and about 3.3 V, while VDDH is between about 100 V and about 300 V. In alternative embodiments of the present invention, other supply voltage ranges can be used as well as other variant circuit topologies for each stage of power amplifier 400.

It can be seen that that the power consumption of the first stage of core amplifier 402 and the input common mode circuit 406 is minimized by referencing these circuits to low voltage supply VDDL. If these circuits were referenced to high voltage power supply VDDH, more power would be dissipated by current source 410 and 412. For example, if the total current consumed by the first stage of core amplifier 402 and the input common mode circuit 406 is $I_{S1}+I_{S2}$, a power savings of $(VDDHZ-VDDL)*(I_{S1}+I_{S2})$ can be achieved by using such a lower voltage power supply for the input stages of amplifier 400. In alternative embodiments of the present invention, other transistor types can be used. For example, NMOS transistors can be used in place of PMOS transistors and PMOS transistors can be used in placed of NMOS transistors depending on the application and its requirements. In further embodiments, bipolar transistors, and transistors of other technologies can be used in place of some or all of the devices illustrated in FIG. 4.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A circuit comprising:
    a two-stage amplifier consisting of
        an input stage biased at a first power supply voltage, and
        an output stage biased at a second power supply voltage, the second power supply voltage greater than the first power supply voltage, wherein the output stage is configured for high voltage operation, wherein the input stage and the output stage comprise fully differential amplifiers;
    a feedback component connected between the output stage to the input stage;
    a first series input resistor coupled between a positive system input and a negative input of the input stage;
    a second series input resistor coupled between a negative system input and a negative input of the input stage;
    a first feedback resistor coupled between a positive output of the output stage and the negative input of the input stage; and
    a second feedback resistor coupled between a negative output of the output stage and the positive input of the input stage.

2. The circuit of claim 1, wherein the input stage comprises a differential pair.

3. The circuit of claim 1, wherein the feedback component is coupled from an output of the input stage to an output of the output stage.

4. The circuit of claim 1, further comprising:
    a differential gain control amplifier comprising an output coupled to a positive system input and a negative system input; and
    a single-ended to differential converter comprising a differential output coupled to an input of the differential gain control amplifier, wherein the feedback component comprises two capacitors.

5. The circuit of claim 1, wherein the two-stage amplifier is an audio amplifier.

6. The circuit of claim 1, wherein the output stage comprises high voltage transistors.

7. The circuit of claim 1, wherein the two-stage amplifier is disposed on an integrated circuit.

8. The circuit of claim 1, wherein the feedback component comprises a capacitor.

9. A semiconductor circuit comprising:
    a two-stage amplifier consisting of a first stage comprising a differential pair loaded by a first active load, the first stage configured to be coupled to a low voltage power supply, and
    a second stage coupled to an output of the first stage, the second stage comprising
        an amplifying transistor coupled to an output of the first stage, and a second active load coupled to an output of the amplifying transistor, wherein the second stage is configured to be coupled to a high voltage power supply greater than 10V; and a feedback capacitor connected between the first stage and the second stage.

10. The semiconductor circuit of claim 9, wherein differential pair, the first and second active loads and the amplifying transistor comprise MOSFET transistors.

11. The semiconductor circuit of claim 9, wherein:

the first and second stages comprise fully differential amplifiers;

the fully differential amplifiers are biased with common mode feedback; and the feedback capacitor comprises two feedback capacitors.

12. The semiconductor circuit of claim 9, wherein the differential pair comprises a plurality of transistors of a first type;

the first active load comprises transistors of a second type, the second type different from the first type;

the amplifying transistor comprises a transistor of the second type; and the second active load comprises a transistor of the first type.

13. The semiconductor circuit of claim 12, wherein:

the first type is PMOS; and the second type is NMOS.

14. The semiconductor circuit of claim 12, wherein:

the amplifying transistor comprises a common source device;

a drain of the first active load is coupled to a gate of the common source device; and the feedback capacitor is coupled from the gate of the common source device to a drain of the common source device.

15. The semiconductor circuit of claim 12, wherein:

the first active load is biased with a common mode feedback circuit coupled to an input of the first stage; and the second active load is biased with a common mode feedback circuit coupled to the output of the second stage.

16. An amplifier comprising:

a differential pair comprising transistors of a first type, wherein the differential pair is referenced to a first power supply;

a plurality of first load transistors of a second type, the second type different from the first type, the plurality of first load transistors comprising drains coupled to drains of the differential pair and sources connected to a reference node;

a plurality of gain transistors of the second type, the plurality of gain transistors comprising gates connected to the drains of the differential pair and to the drains of the first load transistors;

a plurality of second load transistors of the first type, the plurality of second load transistors comprising drains connected to drains of the plurality of gain transistors, and sources connected to a high voltage power supply; and a plurality of capacitors coupled between the drains of the plurality of first load transistors and the drains of the plurality of gain transistors, wherein gates of the differential pair comprises an input to the amplifier, drains of the second load transistors comprise an output of the amplifier.

17. The amplifier of claim 16, wherein:

the first type is PMOS; and the second type is NMOS.

18. The amplifier of claim 16, wherein the plurality of second load transistors comprise high voltage devices.

* * * * *